(12) United States Patent
Agawa et al.

(10) Patent No.: US 6,343,039 B2
(45) Date of Patent: Jan. 29, 2002

(54) DATA TRANSFER CIRCUIT

(75) Inventors: Kenichi Agawa, Yokohama; Toshinari Takayanagi, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/754,131

(22) Filed: Jan. 5, 2001

(30) Foreign Application Priority Data

Jan. 7, 2000 (JP) ............................................ 12-002010

(51) Int. Cl.⁷ ................................................ G11C 7/02
(52) U.S. Cl. ............. 365/203; 365/230.03; 365/189.01; 365/149
(58) Field of Search ............................ 365/203, 230.03, 365/189.01, 149, 230.06, 189.04

(56) References Cited

U.S. PATENT DOCUMENTS 5,959,916 A * 9/1999 Kumar ........................ 365/203

* cited by examiner

*Primary Examiner*—David Nelms
*Assistant Examiner*—David Lam
(74) *Attorney, Agent, or Firm*—Oblon, Spivak, McClelland, Maier & Neustadt, P.C.

(57) ABSTRACT

A data transfer circuit includes data lines for transferring data, interface input/output blocks connected to the data lines for input or output of data through the data lines, and a leakage current monitor and compensate circuit connected to the data lines to detect and store magnitudes of leakage currents in the data lines before input or output of data, and generate and supply to the data lines compensation currents that compensate the leakage currents upon input or output of data. An example of the data line is a bit line of a memory, and an example of the interface input/output block is a memory cell.

20 Claims, 12 Drawing Sheets

DATA TRANSFER CIRCUIT

CROSS REFERENCE TO RELATED APPLICATIONS

The subject application is related to subject matter disclosed in Japanese Patent Application No. 2000-2010 filed on Jan. 7, 2000 in Japan to which the subject application claims priority under Paris Convention and which is incorporated herein by reference.

BACKGROUND OF THE INVENTION

1. Field of the Invention

This invention relates to a data transfer circuit, and more particularly, to a data transfer circuit having a configuration capable of preventing erroneous behaviors beforehand, which are caused by a leakage current from non-selected data transfer devices connected to data lines, which is suitable for preventing erroneous behaviors due to a leakage current from data lines of a semiconductor storage device highly integrated and operative with a low voltage.

2. Related Background Art

Regarding semiconductor storage devices, technologies are under continuous progress for higher recording density, or higher integration, and higher operation speed. Along with wider and wider diffusion of portable information terminals, etc., technologies for enabling operation with a low source voltage, as well, are under energetic development.

Under the tendency, semiconductor devices forming semiconductor integrated circuits are now being required to operate at high speeds with low voltages. The most widely employed technique for this purpose is to lower threshold voltages (Vth) of semiconductor devices. That is, by not only lowering source voltages but also lowering threshold voltages of semiconductor devices, which are activation voltages thereof, speed-up of operation is being attempted.

This tendency of lowering the threshold voltage, however, has resulted in increasing a current that flows during off-period of a semiconductor device, that is, off-leakage current. During off period of a semiconductor device, the semiconductor device is supplied with a voltage of a level that should maintain inoperative. However, as a result of a decrease of the threshold voltage of the semiconductor device, even when the current across the device is desired to be zero, a certain level of leakage current (off-leakage current) undesirably flows. This off-leakage current will cause an increase of erroneous behaviors of the semiconductor integrated circuit and the power consumption during off period of the circuit, with a high possibility.

FIG. 1 is a block diagram of a conventional semiconductor storage device. Referring to FIG. 1, examples of erroneous behaviors of a semiconductor integrated circuit caused by an off-leakage current will be explained below.

This semiconductor storage device is RAM, including memory cells (RAM cells) CL of n+1 rows and m+1 columns. A horizontally continuous series is called one row, and each word line WL is provided for each row to select the row by applying a signal thereto. A vertically continuous series is called a column, and each data line DL is provided for each column to read/write data. That is, with a signal applied to a word line WL, RAM cells in a corresponding row are selected for reading/writing, and data read out from RAM cells of the row, or data to be written in RAM cells of the row, is transmitted as a signal through a data line DL. Input and output of the data read from the RAM cell, or the data to be written in the RAM cell, are controlled by a write/read circuit WRC to which data lines DL are connected, respectively.

Upon reading/writing data, memory cells in a word line supplied with a non-select signal is expected to be inoperative completely, and they are absolutely disconnected from the data line such that no data signal is transmitted to the data line.

However, with the movement to lower source voltages and lower threshold voltages of semiconductor devices, there is the possibility that an off-leakage current flows in a semiconductor device connecting a data storage portion and a data line in each memory cell even during its off period. That is, since the threshold voltage of the semiconductor device is low, a current, although small, undesirably flows even by application of a non-selection signal. As a result, non-selected memory cells are also transmit data signals to the data line by off-leakage currents, and disturb transfer of a data signal from the selected memory cell to the data line.

Normally, non-selected memory cells are much more than selected memory cells, and if off-leakage currents flow in a number of non-selected memory cells simultaneously, erroneous behaviors of the semiconductor device occur.

This problem will be explained with reference to FIG. 1.

For example, when a selection signal is applied to the word line WL0 for the No. 0 row, the expected behavior is that data of the RAM cell CL00 in the No. 0 row and No. 0 column is transmitted to the data line DL0 of the No. 0 column. Assume here that the data stored in the RAM cell CL00 in the No. 0 row and No. 0 column is "1".

However, if all or almost all of data stored in non-selected memory cells in other rows connected to the data line DL0 for the No. 0 column, off-leakage currents result in undesirably flowing to a number of non-selected RAM cells from the data line DL0. These off-leakage currents are going to transmit data "0" to the data line DL0, and disturb transmission of the intended data "1" from the selected RAM cell CL00 in the No. 0 row and No. 0 column.

Then, when these off-leakage currents of the non-selected RAM cells gather and reach a magnitude equivalent to or larger than the current by the behavior of the selected RAM cell, there occurs the error that data "0" is undesirably transmitted to data line DL0.

FIG. 2 is a graph that shows a relation between threshold voltage Vth of memory cells, and the cell current and off-leakage current. Assume here that the semiconductor storage device includes bit lines (word lines) for 128 rows.

In this example, when the threshold voltage Vth is 0.4 V or higher, there is the difference of at least $10^2$ times between the magnitude of the cell current of one row and the off-leakage current of bit lines of 128 rows, and erroneous operation will not occur.

However, as the threshold voltage Vth decreases to 0.3V and to 0.2V, the magnitude of the cell current of one row and the off-leakage current of bit lines of 128 rows get closer, and when the threshold voltage Vth is around 0.2V, both currents are very close, depending upon process variations of memory cells. If the movement toward lower threshold voltage progresses, the magnitude of the cell current of one row and the magnitude of the off-leakage current of bit lines of 128 rows will become approximately equal, or the magnitude of the off-leakage current of bit lines of 128 rows may become larger.

Although the graph of FIG. 2 is of a semiconductor storage device by a 0.18 μm process, it is possible that, in a semiconductor storage device with 256 rows and 256 columns of a 0.07 μm process generation, the threshold voltage Vth decreases to 0.23 V and the leakage current reaches three times the cell current.

In such cases, data transmission by a cell current of a selected memory cell will be disturbed by the off-leakage current, erroneous data will be transmitted from non-selected memory cells, and the semiconductor storage device will operate erroneously.

SUMMARY OF THE INVENTION

It is therefore an object of the invention to provide a data transfer circuit having a configuration capable of preventing erroneous behaviors beforehand, which are caused by a leakage current of an interface input/output block such as non-selected data transfer devices connected to data lines.

According to the invention, there is provided a data transfer circuit comprising data lines for transferring data, interface input/output blocks connected to the data lines to input or output data through the data lines, and a leakage current monitor/compensate circuit connected to the data lines to monitor and store the magnitude of a leakage current in the data lines before input or output of the data and to generate and supply to the data lines a compensation current for compensating the leakage current upon input or output of the data. This configuration prevents, beforehand, erroneous behaviors caused by the leakage current of the interface input/output blocks connected to the data lines.

In a more specific configuration according to the invention, the data transfer circuit comprises data lines for transferring data, interface input/output blocks connected to the data lines to input or output data through the data lines, a leakage current monitor circuit connected to the data lines to monitor the potential of the data lines generated in response to the magnitude of a leakage current in the data lines before input or output of data, and a capacitor for storing an electric charge responsive to the detected potential of the data lines and generating a potential equivalent to the potential of the data lines, and a leakage current compensate circuit for generating and supplying to the data lines a compensation current for compensating the leakage current on the basis of the potential generated by the capacitor upon input or output of the data.

These configurations according to the invention, when employed in a semiconductor storage device having memory cells as interface input/output blocks, can prevent, beforehand, erroneous behaviors caused by an off-leakage current of the memory cells connected to the data lines.

DESCRIPTION OF THE PREFERRED EMBODIMENTS

A data transfer circuit according to the invention includes a leakage current monitor circuit for monitoring the magnitude of a leakage current in data lines by non-selected data transmission devices connected to data lines, a compensate circuit for compensating the leakage current by supplying a compensation current responsive to the detected magnitude of the leakage current upon data transfer operation through the data lines. This configuration prevents, beforehand, erroneous behaviors caused by the leakage current of non-selected data transfer devices connected to the data lines.

For example, in a semiconductor storage device, in case an off-leakage current of a non-selected memory cell flows in a data line, the magnitude of the off-leakage current is previously monitored and stored. Then, upon reading data from a selected memory cell, or upon writing data into a selected memory cell, a compensation current that compensates the detected and stored off-leakage current is generated and supplied to the data line. As a result, erroneous operation of the semiconductor storage device caused by the off-leakage current of the non-selected memory cell connected to the data line can be prevented beforehand.

Explained below are embodiments of the data transfer circuit according to the invention with reference to the drawings.

Figure 1:
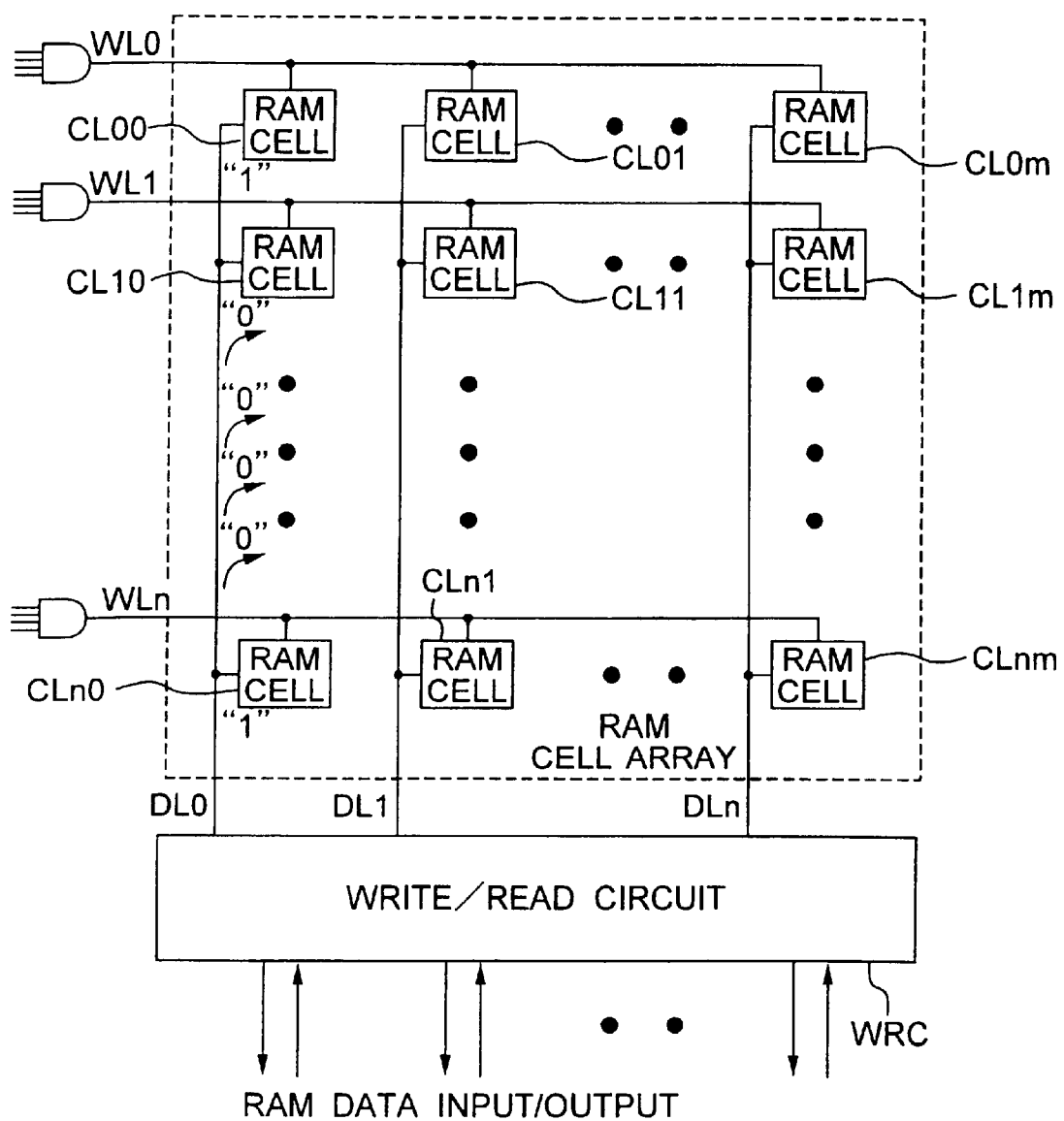
FIG. 1 is a block diagram of a conventional semiconductor storage device.
Figure 2:
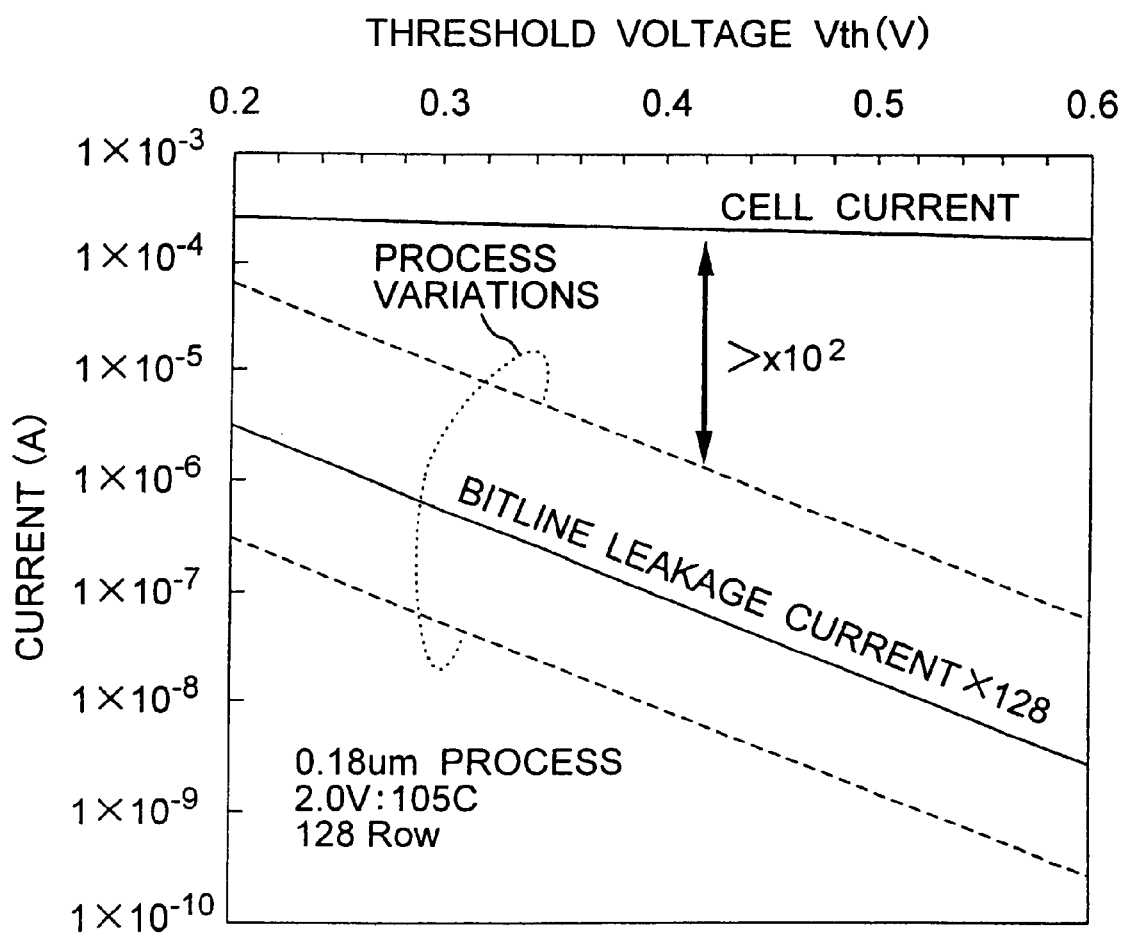
FIG. 2 is a graph that shows a relation of threshold voltages Vth of memory cells, and cell current and off-leakage currents.
Figure 3A:
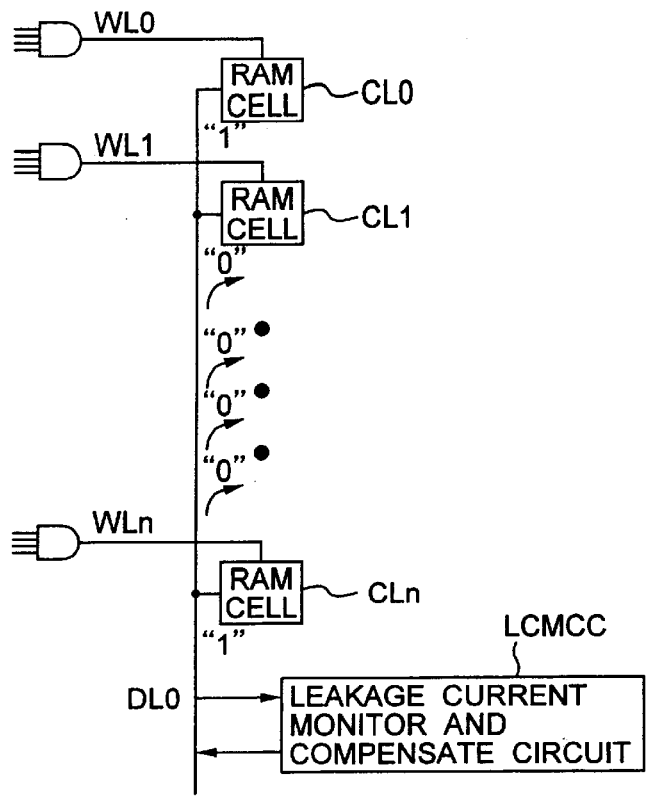
FIGS. 3A and 3B are block diagrams that show a configuration of a data transfer circuit according to the first embodiment of the invention.
Figure 3B:
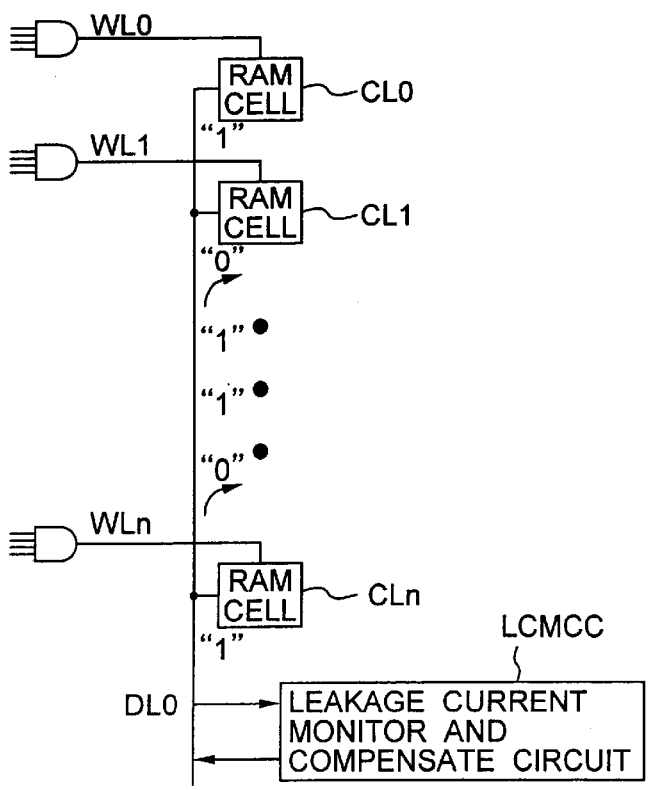

FIGS. 3A and 3B are block diagrams that show a configuration of a data transfer circuit according to the first embodiment of the invention.

The data transfer circuit according to the first embodiment has the most basic configuration for application of the data transfer circuit according to the invention to the semiconductor storage device. A leakage current monitor circuit and a leakage current compensate circuit are shown in a single block as the leakage current monitor and compensate circuit LCMCC. For simplicity of explanation and illustration, here is shown only the part of the No. 0 column.

The data transfer circuit according to the first embodiment includes word lines WL0, WL1, . . . , WLn provided in the No. 0 row to the No. n row; RAM cells CL0, CL1, . . . , CLn that are memory cells provided in the No. 0 row through the No. n row and connected to the word lines of the respective rows; a data line DL0 provided in the No. 0 column connected to all RAM cells in the No. 0 column; and the leakage current monitor and compensate circuit LCMCC connected to the data line DL0 to monitor and store the magnitude of a leakage current in the data line DL0, generate and supply to the data line DL0 a compensation current that compensate the detected and stored leakage current upon subsequent input or output of data through the data line DL0.

After storage of data in respective RAM cells, the leakage current detect and compensate circuit LCMCC monitors and stores the magnitude of the leakage current in the data line DL0 before subsequent input or output through the data line DL0. The magnitude of the leakage current in the data line DL0 depends upon the data stored in respective RAM cells connected to the data line DL0.

For example, in the example of FIG. 3A, assume that data "1" is stored only in the RAM cell CL0 in the No. 0 row and the RAM cell CLn in the No. n row, and the other cells store data "0". In the example of FIG. 3B, assume that the RAM cell CL0 in the No. 0 row, RAM cell CLn in the No. n row and some other RAM cells store data "1", and the remainder RAM cells store data "0". In this situation, as apparent from comparison between FIG. 3A and FIG. 3B, one with a larger number of RAM cells storing data "0" produces a larger total leakage current.

Due to the dependency of the leakage current upon data, detection and storage of the leakage current has to be carried out between storage of data to respective RAM cells and subsequent data input or output through the data line DL0.

Further, after storage of data in respective RAM cells, magnitude of the leakage current in the data line DL0 depends upon the potential of the data line. Therefore, it is recommended to detect magnitude of the leakage current in the data line DL0 as a function of the potential of the data line, so as to make a correction based on the function of the potential of the data line upon subsequent data input or output through the data line DL0, and generate and supply to the data line a compensation current that compensates the detected and stored off-leakage current.

Figure 4:
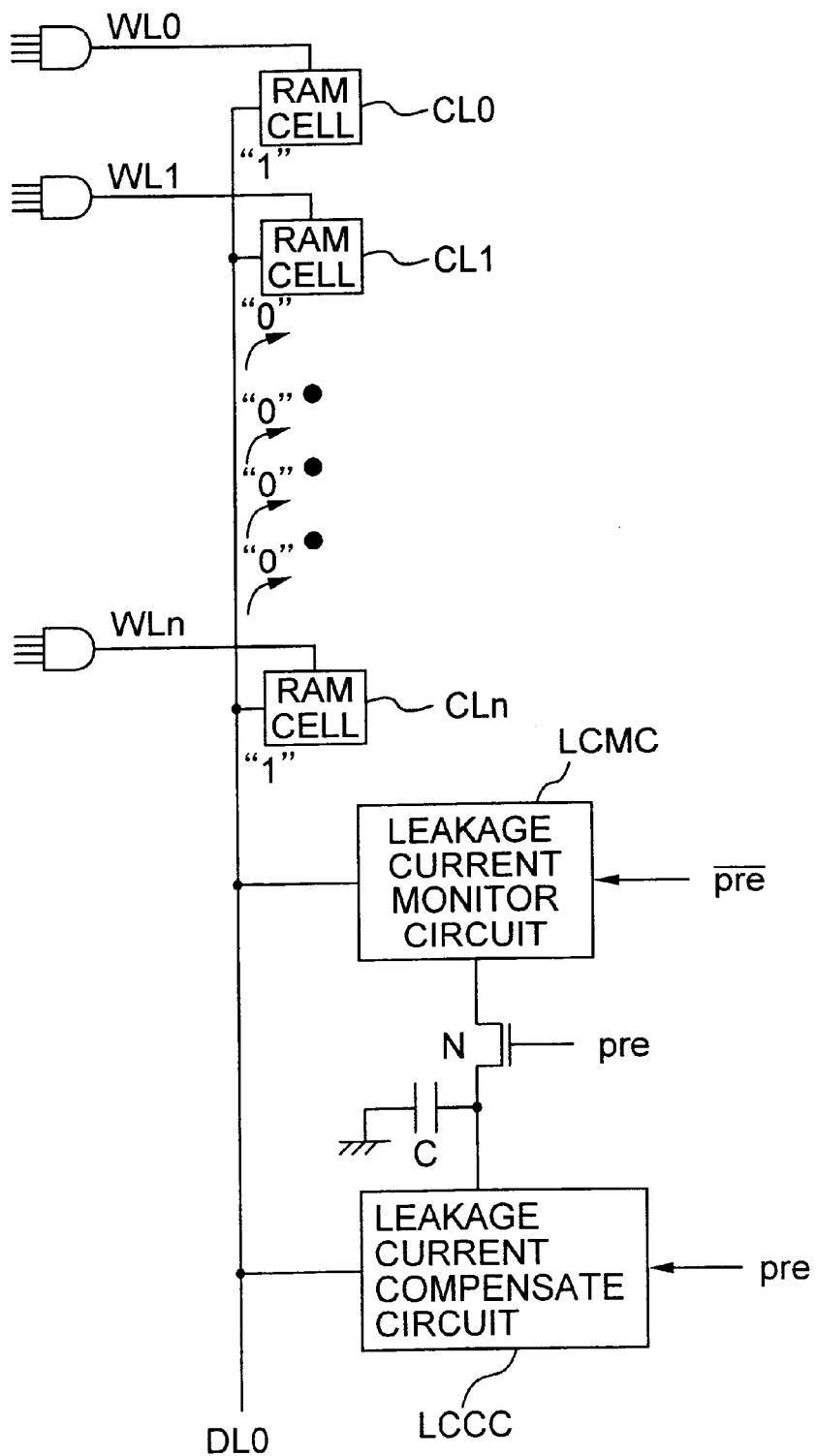
FIG. 4 is a block diagram that shows a configuration of a data transfer circuit according to the second embodiment of the invention.

FIG. 4 is a block diagram that shows a configuration of a data transfer circuit according to the second embodiment of the invention. The data transfer circuit according to the second embodiment has a more specific version of the data transfer circuit according to the first embodiment. That is, the configuration of FIG. 4 divides the leakage current monitor and compensate circuit LCMCC shown in FIGS. 3A and 3B into a leakage current monitor circuit LCMC and a leakage current compensate circuit LCCC, and connects them with an N-channel MOS transistor N, which is a transfer gate. Further, the configuration of FIG. 4 includes a capacitor connected between connection node of the N-channel MOS transistor N and the leakage current compensate circuit LCCC, and the ground connection node GND to store the magnitude of the leakage current as a function of the potential of the data line by storage of an electric charge derived from the detected leakage current and to have the leakage current compensate circuit LCCC generate a compensation current for compensating the leakage current on the basis of the potential produced by storage of the electric charge. Similarly to FIGS. 3A and 3B, FIG. 4. also shows the configuration of the No. 0 column alone for simplicity of explanation and illustration.

For control of the leakage current monitor circuit LCMC, leakage current compensate circuit LCCC and N channel MOS transistor N, a precharge signal pre for controlling the precharge of the data line DL0 is used. In this example, the precharge circuit controlled by the precharge signal pre is low-active. That is, the precharge circuit is activated for precharge operation when the input control signal is L (low) level. Although FIG. 4 does not show, the leakage current monitor circuit LCMC can be configured to function as the precharge circuit as well as explained later with reference to another embodiment.

The precharge circuit is supplied with a reverse precharge signal /pre (the symbol "/" prefixed to a signal label herein means a logical reversal) such that precharge operation takes place when the precharge signal becomes a H (high) level, and therefore, the reverse precharge signal /pre is input also to the leakage current monitor circuit LCMC. On the other hand, the precharge signal pre is input to the leakage current compensate circuit LCCC and the N-channel MOS transistor N.

In summary, the data transfer circuit according to the second embodiment of the invention includes: the word lines WL0, WL1, ..., WLn provided in the No. 0 row to the No. n row; the RAM cells CL0, CL1, ..., CLn that are memory cells provided in the No. 0 row through the No. n row and connected to the word lines of the respective rows; the data line DL0 provided in the No. 0 column and connected to all RAM cells in the No. 0 column; the leakage current monitor circuit LCMC connected to the data line DL0 and detecting the magnitude of the leakage current in the data line DL0 in receipt of the reverse precharge signal during data line precharge operation; an N-channel MOS transistor N that is a transfer gate having one end connected to the leakage current monitor circuit LCMC to transfer the detected leakage current in receipt of the precharge signal during data line precharge operation; the capacitor C provided between the connection node of the other end of the N-channel MOS transistor N and the leakage current compensate circuit LCCC, and the ground connection node GND to store the magnitude of the leakage current by storage of an electric charge by the detected leakage current and generate a potential corresponding to the magnitude of the detected leakage current to a high-potential electrode; and the leakage current compensate circuit LCCC connected to the data line DL0 and, in receipt of the precharge signal, generate a compensation current corresponding to the potential of the high-potential electrode of the capacitor C during data transfer operation through the data line DL0 and supplies it to the data line DL0.

Next explained are behaviors of the data transfer circuit according to the second embodiment. When the precharge signal pre becomes the H level, i.e., when the reverse precharge signal /pre becomes the L. level, simultaneously with the start of the precharge operation, the leakage current monitor circuit LCMC starts its leakage current monitor operation. Eventually, upon completion of the precharge operation, the leakage current monitor operation is also completed.

During the leakage current monitor operation, the precharge signal pre remains the H level. Therefore, the N-channel MOS transistor N remains ON. Thus the capacitor C is charged with an electric charge by the detected leakage current. Since the precharge signal pre changes from the H level to the L level upon completion of the precharge operation, at that moment, the N-channel MOS transistor N is turned OFF, charging of the capacitor C by the detected leakage current finishes, the amount of the electric charge accumulated in the capacitor C is determined, and the detected leakage current is stored. Since the magnitude of the leakage current is stored by charging the capacitor C with the detected leakage current from the data line DL0, magnitude of the leakage current is necessarily corrected in response to the potential of the data line DL0.

Upon switching of the precharge signal pre from the H level to the L level, completion of the precharge operation and storage of the detected leakage current in the capacitor C, simultaneously therewith, data read from the RAM cell or data write in the RAM cell, i.e. data transfer operation through the data line DL0, is started, and simultaneously therewith, leakage current compensate operation by the leakage current compensate circuit LCCC is also started. Magnitude of the compensation current is determined by the potential of the high-potential electrode of the capacitor C. The compensation current generated in response to the detected leakage current and the potential of the data line DL0 has the same polarity as the leakage current and the oppositely equal magnitude, it compensates the leakage current, and prevents, beforehand, erroneous behaviors caused by the off-leakage current of non-selected RAM cells during data transfer operation.

The transfer gate is not limited to the N-channel MOS transistor N, but any desirable switching element such as P-channel MOS transistor, bipolar transistor, or the like, may be used.

Figure 5:
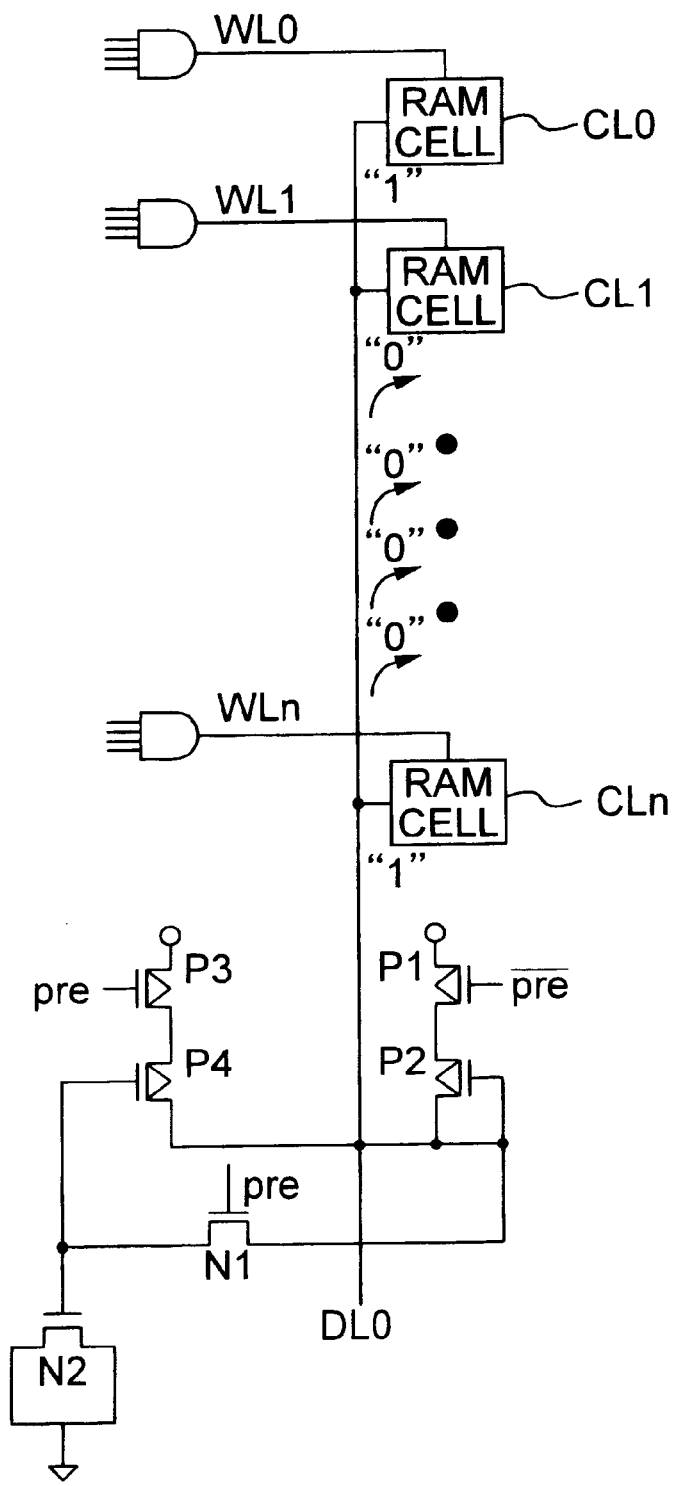
FIG. 5 is a block diagram that shows a configuration of a data transfer circuit according to the third embodiment of the invention.

FIG. 5 is a block diagram that shows a configuration of a data transfer circuit according to the third embodiment of the invention. The data transfer circuit according to the third embodiment has a more specific version of the data transfer circuit according to the second embodiment. Similarly to FIGS. 3A, 3B and FIG. 4, FIG. 5 also shows the configuration of the No. 0 column alone for simplicity of explanation and illustration.

The data transfer circuit according to the third embodiment of the invention includes: the word lines WL0, WL1, . . . , WLn provided in the No. 0 row to the No. n row; the RAM cells CL0, CL1, . . . , CLn that are memory cells provided in the No. 0 row through the No. n row and connected to the word lines of the respective rows; the data line DL0 provided in the No. 0 column and connected to all RAM cells in the No. 0 column; and a first P-channel MOS transistor P1 with its source connected to a source potential node and its gate supplied with a reverse precharge signal; a second P-channel transistor P2 connected between the drain of the first P-channel MOS transistor P1 and the data line DL0; a third P-channel MOS transistor P3 with its source connected to a source potential node and its gate supplied with a precharge signal; a fourth P-channel MOS transistor P4 connected between the drain of the third P-channel MOS transistor and the data line DL0; a first N-channel MOS transistor N1 connected between the gate and the drain of the second P-channel MOS transistor P2 and the gate of the fourth P-channel MOS transistor P4 and having the gate supplied with the precharge signal; and a capacitor transistor made up of a second N-channel MOS transistor with its gate connected to the gate of the fourth P-channel MOS transistor P4 and its source and drain connected to the ground potential node.

It may be regarded that the first and second P-channel MOS transistors P1, P2 and the first and second N-channel MOS transistor N1, N2 correspond to the leakage current monitor circuit LCMC whereas the third and fourth P-channel MOS transistor P3, P4 correspond to the leakage current compensate circuit LCCC. Alternatively, it may be regarded that the first and second P-channel MOS transistors P1, P2 correspond to the leakage current monitor circuit LCMC, the third and fourth P-channel MOS transistors P3, P4 correspond to the leakage current compensate circuit LCCC, the first N-channel MOS transistor N1 corresponds to the transfer gate connecting the leakage current monitor circuit LCMC and the leakage current compensate circuit LCCC, and the second N-channel MOS transistor N2 corresponds to a capacitor for storing an electric charge by the detected leakage current.

Next explained are behaviors of the data transfer circuit according to the third embodiment. During precharge period of the data line DL0, the precharge signal pre becomes the H level, and the reverse precharge signal /pre becomes the L level. Therefore, the first P-channel MOS transistor P1 is ON, the third P-channel MOS transistor P3 is OFF, and the first N-channel MOS transistor N1 is ON. Further, at the start of the precharge operation, since the potential of the data line DL0 is the L level, the second P-channel MOS transistor P2 is ON. Since the first and second P-channel MOS transistor P1, P2 are ON, the data line DL0 is precharged, and its potential gradually increases. When VDD is the source potential and Vthp is the threshold voltage of the P-channel MOS transistor, the potential of the data line DL0 increases only to VDD−Vthp in maximum. However, if an off-leakage current of RAM cells flows in the data line DL0, the potential of the data line DL0 becomes lower than VDD−Vthp.

The potential of the data line DL0 is transmitted to the gate of the second N-channel MOS transistor N2 through the first N-channel MOS transistor N1, and an electric charge corresponding to the potential of the data line DL0 is accumulated in the capacitor transistor made up of the second N-channel MOS transistor N2.

As the precharge of the data line DL0 progresses and the potential of the data line DL0 sufficiently rises, since the potential of the data line DL0 is input to the gate of the second P-channel MOS transistor P2, the second P-channel MOS transistor P2 turns OFF.

After that, when data read from a RAM cell in the No. 0 column, or data write to the RAM cell in the No. 0 column, i.e. the period of data input/output operation through the data line DL0, is started, the precharge signal pre becomes the L level, the reverse precharge signal /pre becomes the H level, and the precharge operation finishes. Therefore, the first P-channel MOS transistor P1 turns OFF, the third P-channel MOS transistor P3 turns ON, and the first N-channel MOS transistor N1 turns OFF.

At that time, the gate potential of the second N-channel MOS transistor N2 is input to the gate of the fourth P-channel MOS transistor P4. That is, since the potential generated on the basis of the electric charge accumulated in the capacitor transistor made up of the second N-channel MOS transistor N2 by the leakage current of the data line DL0 is input to the gate of the fourth P-channel MOS transistor P4, the fourth P-channel MOS transistor P4 turns ON to pass the compensation current of a magnitude corresponding to the leakage current of the data line DL0, and the compensation current flows into the data line DL0. As a result, the off-leakage current in the data line DL0 is compensated by the compensation current, and erroneous behaviors of the semiconductor storage device caused by the off-leakage current can be prevented beforehand.

Strictly, it is desirable that the potential of the data line DL0, i.e. the drain potential of the fourth P-channel MOS transistor P4, is sufficiently low, and operation of the fourth P-channel MOS transistor P4 is conducted in the saturation region. In this embodiment, since a voltage drop occurs in the second P-channel MOS transistor P2, the potential of the data line DL0 is sufficiently low.

The first and third P-channel MOS transistors P1, P3 may be replaced by N-channel MOS transistors. The transfer gate made up of the first N-channel MOS transistor N1 need not be an N-channel MOS transistor, but any desired switching element such as P-channel MOS transistor, for example, may be used. The capacitor made up of the second N-channel MOS transistor N2 need not be an N-channel MOS transistor, but any desirable capacitor may be used. Additionally, each MOS transistor may be replaced by a bipolar transistor.

Figure 6:
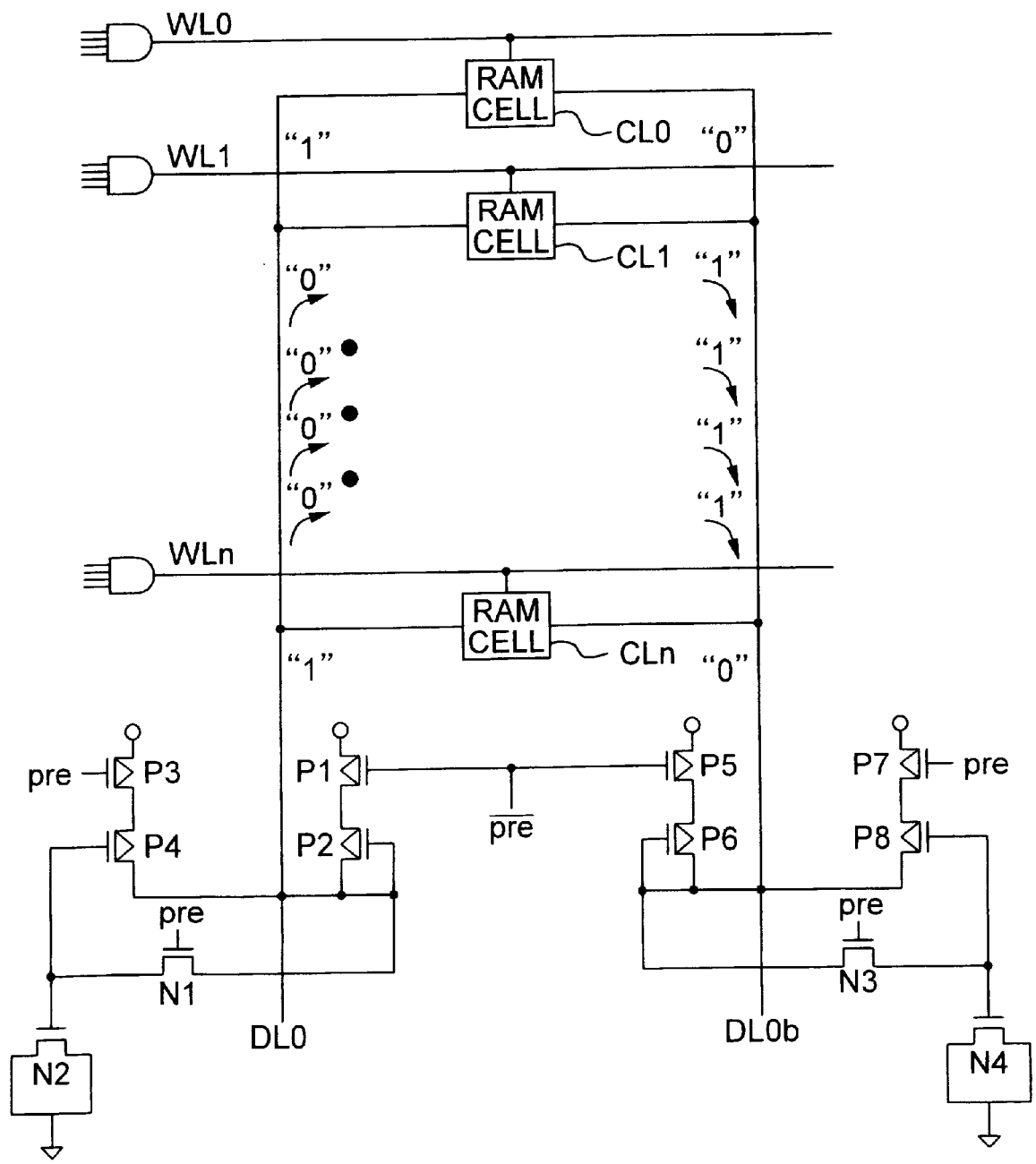
FIG. 6 is a block diagram that shows a configuration of a data transfer circuit according to the fourth embodiment of the invention.

FIG. 6 is-a block diagram that shows a configuration of a data transfer circuit according to the fourth embodiment of the invention. Similarly to FIG. 3A through FIG. 5, FIG. 6 also shows the configuration of the No. 0 column alone for simplicity of explanation and illustration.

The data transfer circuit according to the fourth embodiment of the invention is an example in which each RAM cell forming a semiconductor storage device has a differential type double-end configuration, such as SRAM, for example.

Therefore, in comparison with the data transfer circuit according to the third embodiment, although they are equal in that the data line DL0 of the No. 0 column is connected to one-side ends of RAM cells in the No. 0 column, the fourth embodiment is different from the third embodiment in further including a complementary data line DL0b of the No. 0 column, which is connected to the other-side ends of the RAM cells in the No. 0 column, and an additional MOS transistor circuit forming the leakage current monitor circuit LCMC and the leakage current compensate circuit LCCC also for the complementary data line DL0b in the No. 0 column. More specifically, it includes, also for the complementary data line DL0b, a fifth, a sixth, a seventh and an eighth P-channel MOS transistors P5, P6, P7 and P8 and a third and a fourth N-channel MOS transistors N3 and N4 corresponding to the first, second, third and fourth P-channel MOS transistors P1, P2, P3 and P4 and the first and second N-channel MOS transistors N1 and N2 provided on the part of the data line DL0. Connection of MOS transistors and input portions of the precharge signal pre and the reverse precharge signal /pre on the part of the complementary data line DL0b are identical to those on the part of the data line DL0. Operations of the leakage current monitor circuit LCMC and the leakage current compensate circuit LCCC on the part of the complementary data line DL0b are also identical to those on the part of the data line DL0.

The first, third, fifth and seventh P-channel MOS transistors P1, P3, P5 and P7 may be replaced by N-channel MOS transistors. The transfer gate made up of the first and third N-channel MOS transistors N1 and N3 need not be N-channel MOS transistors, but any desirable switching element such as P-channel MOS transistors, for example, can be used. The capacitors made up of second and fourth N-channel MOS transistors N2, N4 need not be those made of N-channel MOS transistors, but any desired capacitors may be used. Further, each MOS transistor may be replaced with a bipolar transistor.

Figure 7:
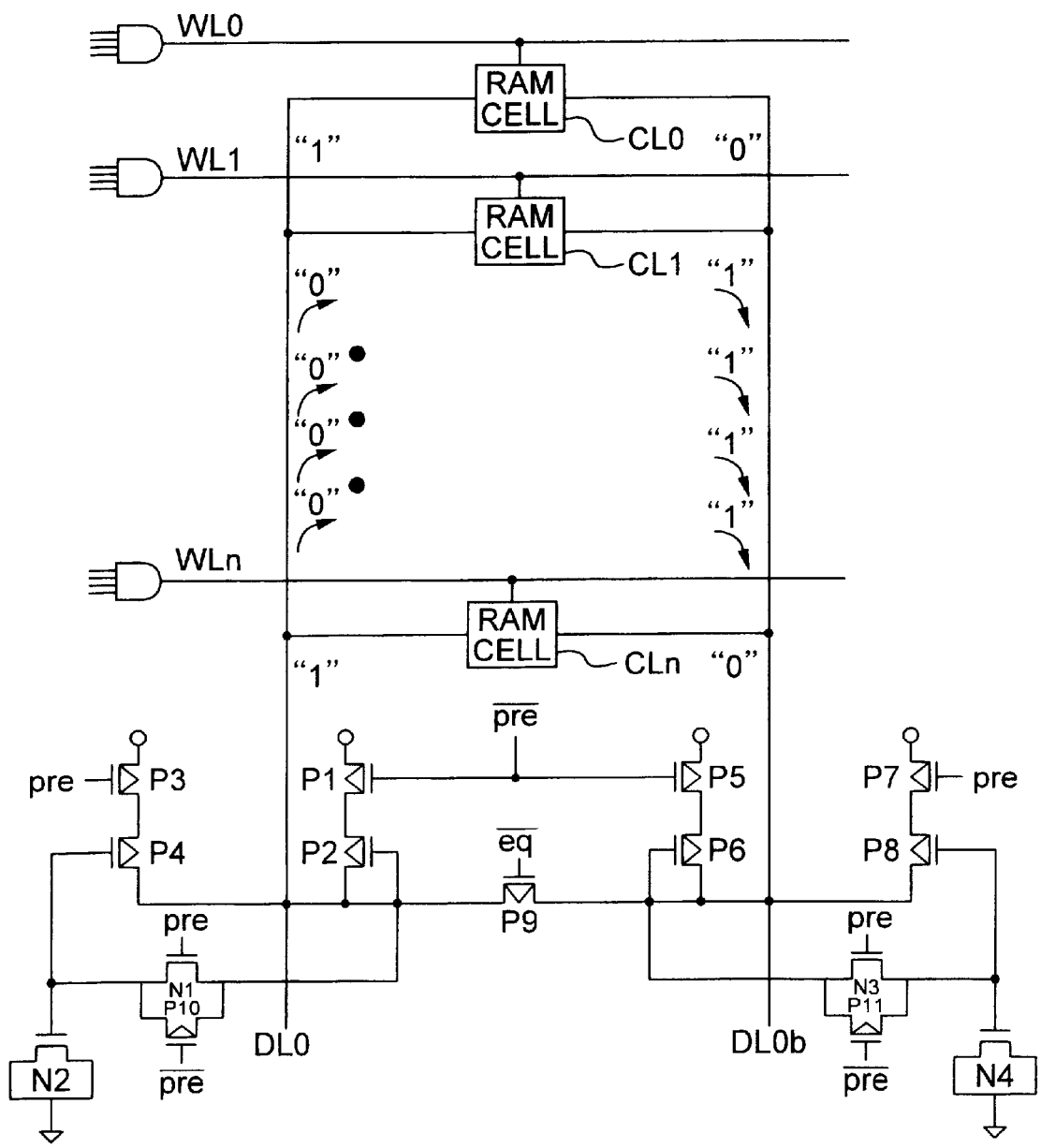
FIG. 7 is a block diagram that shows a configuration of a data transfer circuit according to the fifth embodiment of the invention.

FIG. 7 is a block diagram that shows a configuration of a data transfer circuit according to the fifth embodiment of the invention. Similarly to FIG. 3A through FIG. 6, FIG. 7 also shows the configuration of the No. 0 column alone for simplicity of explanation and illustration.

Similarly to the data transfer circuit according to the fourth embodiment, the data transfer circuit according to the fifth embodiment is an alternative of the configuration in which each RAM cell forming a semiconductor storage device has a differential type double-end structure, such as SRAM, for example.

In comparison with the data transfer circuit according to the fourth embodiment, the data transfer circuit according to the fifth embodiment is different in including additional components. That is, the data transfer circuit according to the fifth embodiment includes: a ninth P-channel MOS transistor P9 connected between the data line DL0 and the complementary data line DL0b and supplied at is gate with a reverse equalize signal /eq to equalize the potential of the data line DL0 and the potential of the complementary data line DL0b; a tenth P-channel MOS transistor P10 forming a pair with the first N-channel MOS transistor N1 to form a transfer gate and supplied at its gate with a reverse precharge signal /pre; and an eleventh P-channel MOS transistor P11 forming a pair with the third N-channel MOS transistor N3 to form a transfer gate and supplied at its gate with a reverse precharge signal /pre.

Operations of the leakage current monitor circuits LCMC and the leakage current compensate circuits LCCC on the part of the data line DL0 and on the part of the complementary data line DL0b are identical to those of the data transfer circuit according to the fourth embodiment. However, with the additional tenth and eleventh P-channel MOS transistors P10 and P11, even when potentials of the data line DL0 and the complementary data line DL0b are relatively high, these potentials can be readily transmitted to the capacitor transistors N2 and N4 without a potential loss.

Additionally, since the ninth P-channel MOS transistor P9 is added, in the data transfer circuit according to the fifth embodiment, potential of the data line DL0 and potential of the complementary data line DL0b are equalized.

However, in the data transfer circuit according to the fifth embodiment shown in FIG. 7, since the leakage current monitor circuits LCMC of both the data line DL0 and the complementary data line DL0b are configured to be controlled by the precharge signal pre and the reverse precharge signal /pre, detection of the leakage current of the data line DL0 and the complementary data line DL0b is performed during precharge operation.

The first, third, fifth, seventh and ninth P-channel MOS transistors P1, P3, P5, P7 and P9 may be replaced by N-channel MOS transistors. The transfer gate made up of the first N-channel MOS transistor N1 and the tenth P-channel MOS transistor P10, and the transfer gate made up of the third N-channel MOS transistor N3 and the eleventh P-channel MOS transistor P11 are not limited to these configurations, but any desired switching elements may be used. The capacitor made up of the second and fourth N-channel MOS transistors N2 and N4 need not be made of N-channel MOS transistors, and any capacitor may be used. Further, each MOS transistor may be replaced with a bipolar transistor.

Figure 8:
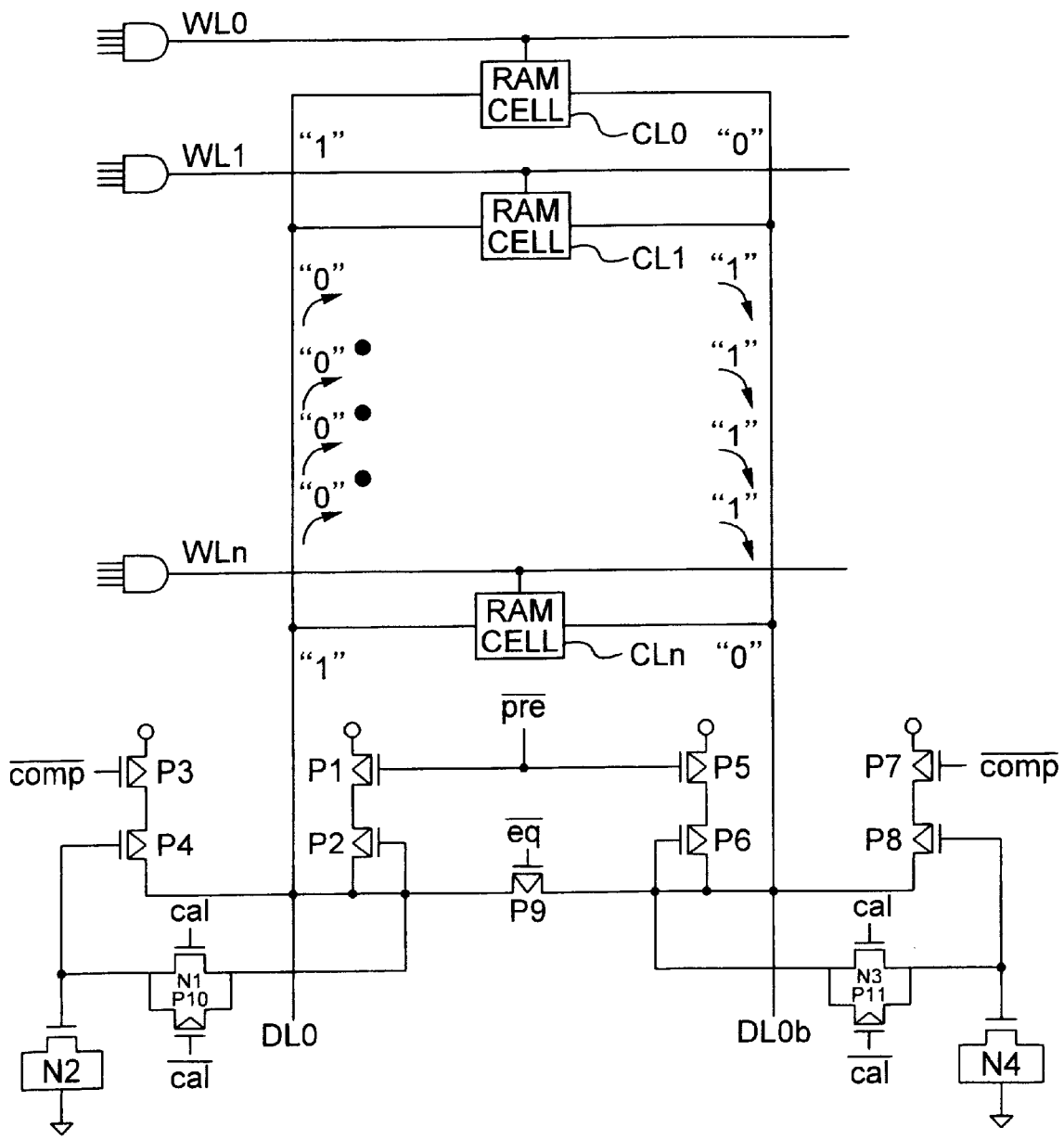
FIG. 8 is a block diagram that shows a configuration of a data transfer circuit according to the sixth embodiment of the invention.

FIG. 8 is a block diagram that shows a configuration of a data transfer circuit according to the sixth embodiment of the invention. Similarly to FIG. 3A through FIG. 7, FIG. 8 also shows the configuration of the No. 0 column alone for simplicity of explanation and illustration.

Similarly to the data transfer circuit according to the fourth and fifth embodiment, the data transfer circuit according to the sixth embodiment is an alternative of the configuration in which each RAM cell forming a semiconductor storage device has a differential type double-end structure, such as SRAM, for example.

The circuit arrangement of the data transfer circuit according to the sixth embodiment is identical to the circuit arrangement of the data transfer circuit according to the fifth embodiment. However, the data transfer circuit according to the sixth embodiment is different in part of control signals used for controlling operations, as compared with the data transfer circuit according to the fifth embodiment.

That is, gates of the third and seventh P-channel MOS transistor P3 and P7 are supplied with reverse compensation control signals /comp instead of the precharge signals pre. Further, gates of the first and third N-channel MOS transistors N1 and N3, which are counterparts of transfer gates of the data line DL0 and the complementary data line DL0b, are supplied with detection control signals cal instead of the precharge signals pre. Furthermore, gates of the tenth and eleventh P-channel MOS transistors P10 and P11, which are counterparts of transfer gates of the data line DL0 and the complementary data line DL0b, are supplied with reverse detection control signals /cal instead of the reverse precharge signal /pre.

Figure 9:
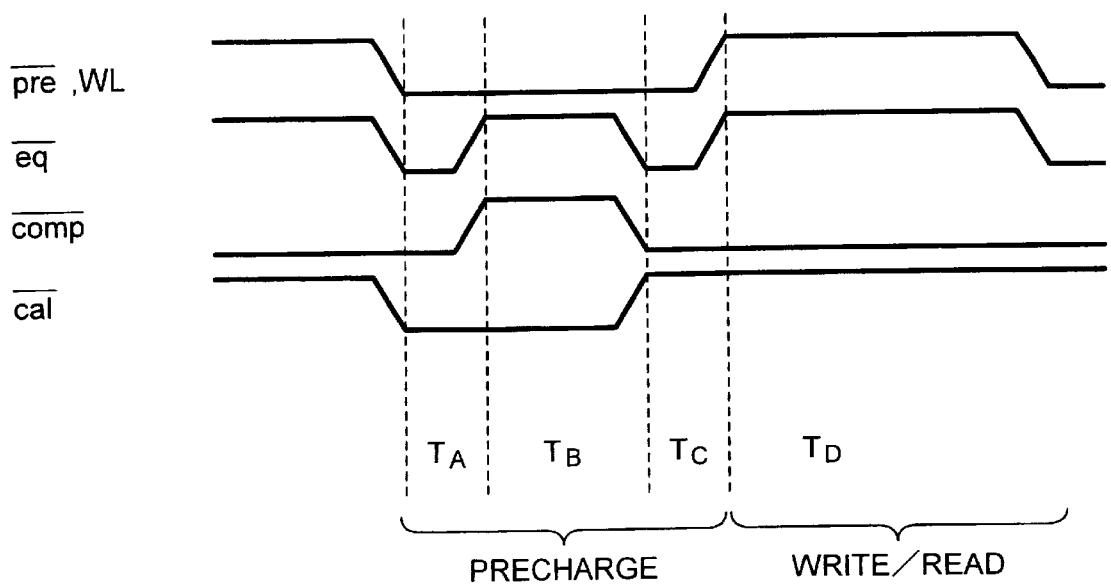
FIG. 9 is a timing chart that shows waveforms of control signals in the data transfer circuit according to the sixth embodiment of the invention.

FIG. 9 is a timing chart that shows waveforms of control signals in the data transfer circuit according to the sixth embodiment of the invention.

With reference to FIGS. 8 and 9, behaviors of the data transfer circuit according to the sixth embodiment of the invention will be explained.

When the reverse precharge signal /pre and the potential of the word line WL fall to the L level, the first and fifth P-channel MOS transistors P1 and P5 turn ON, and the RAM cells are turned OFF. At that time, since the data line DL0 and the complementary data line DL0b are in the L level, the second and sixth P-channel MOS transistors are also ON. Therefore, precharge operations of the data line DL0 and the complementary data line DL0b are started, and they are continued for periods TA, TB and TC as shown in FIG. 9.

On the other hand, in the period TA, the reverse equalize signal /eq falls to the L level. Therefore, the ninth P-channel MOS transistor P9 turns ON, and equalize operation is carried out.

Further, in the period TA, since the reverse compensation control signal /comp is in the L level, the third and seventh P-channel MOS transistors P3 and P7 are ON. Further, since the reverse detection control signal /cal are also in the L level, all of the first and third N-channel MOS transistors N1 and N3 and the tenth and eleventh P-channel MOS transistors P10 and P11 forming the transfer gates of the data line DL0 and the complementary data line DL0b are turned ON. Therefore, gate potentials of the fourth and eighth P-channel MOS transistors P4 and P8 become the L level, and the fourth and eighth P-channel MOS transistors P4 and P8 also turn ON.

As a result, in the period TA, the data line DL0 is precharged trough the first, second P-channel MOS transistors P1, P2 and the third and fourth MOS transistors P3, P4. Additionally, the complementary data line DL0b is precharged through the fifth and sixth P-channel MOS transistors P5, P6 and the seventh and eighth P-channel MOS transistors P7, P8.

Therefore, in the period TA, the data transfer circuit according to the sixth embodiment carries out precharge operation and equalize operation of the data line DL0 and the complementary data line DL0b with the current double that of the data transfer circuit according to the fifth embodiment of the invention. As a result of doubling the current, precharge operation and equalize operation can be improved in speed and reliability.

Additionally, since the transfer gates of the data line DL0 and the complementary data line DL0b are ON, respectively, leakage current detection operations of the data line DL0 and complementary data line DL0b are also started from the period TA.

In the next period TB, the reverse equalize signal /eq and the reverse compensation control signal /comp rise to the H level, and the ninth P-channel MOS transistor P9 and the third and seventh P-channel MOS transistors P3 and P7 turn OFF. Therefore, in the period TB, equalize operation does not take place, and the data line DL0 and the complementary data line DL0b are electrically separated. However, since the first and fifth P-channel MOS transistors P1 and P5 remain ON, precharge operation is continued. Further, since the transfer gates of the data line DL0 and the complementary data line DL0 also remain ON, leakage current monitor operations of the data line DL0 and the complementary data line DL0 are also continued.

As the precharge of the data lien DL0 and the complementary data line DL0b progresses, potentials of the data line DL0 and the complementary data line DL0b gradually increase. The potential of the data line DL0 is stored in the capacitor made up of the second N-channel MOS transistor N2 via the transfer gate made up of the first N-channel MOS transistor N1 and the tenth P-channel MOS transistor P10. Similarly, the potential of the complementary data line DL0b is stored in the capacitor made up of the N-channel MOS transistor N4 via the transfer gate made up of the third N-channel MOS transistor N3 and the eleventh P-channel MOS transistor P1. Since the data line DL0 and the complementary data line DL0b are electrically separated in the period TB, the leakage current detecting capacitors of the data line DL0 and the complementary data line DL0b store potentials reflecting respective leakage currents of the data line DL0 and the complementary data line DL0b.

In the next period TC, the reverse detection control signal /cal rises, transfer gates of the data line DL0 and the complementary data line DL0b turn OFF, respectively, and the leakage current detecting operations of the data line DL0 and the complementary data line DL0b terminate.

Additionally, the reverse equalize signal /eq and the reverse compensation control signal /comp fall to the L level, the ninth P-channel MOS transistor P9 and the third and seventh P-channel MOS transistors P3 and P7 turn ON, and the leakage current compensation operation is started. At that time, although the second and sixth P-channel MOS transistors P2 and P6 become semi-conductive in response to potentials of the data line DL0 and the complementary data line DL0b, they turn OFF when the potentials of the data line DL0 and the complementary data line DL0b rise sufficiently. On the other hand, the fourth and eighth P-channel MOS transistors P4 and P8 become semi-conductive in response to the potentials stored in the capacitors made up of the second and fourth N-channel MOS transistors N2 and N4.

That is, since the gates of the fourth and eighth P-channel MOS transistors P4 and P8 are supplied with potentials based on electric charges accumulated in the capacitor transistors N2 and N4 by leakage current of the data line DL0 and the complementary data line DL0b, respectively, the fourth and eight P-channel MOS transistors P4 and P8 turn ON to pass compensation currents of magnitudes corresponding to the leakage currents of the data line DL0 and the complementary data line DL0b, respectively, and the compensation currents flow into the data line DL0 and the complementary data line DL0b, respectively. As a result, the off-leakage currents of the data line DL0 and the complementary data line DL0b are compensated by the compensation currents, and erroneous behaviors of the semiconductor storage device caused by the off-leakage currents can be prevented beforehand.

Moreover, since the data transfer circuit according to the sixth embodiment starts the leakage current compensation operation earlier than the data transfer circuit according to the fifth embodiment, erroneous behaviors of the semiconductor storage device caused by the off-leakage current can be prevented reliably.

In the next period Td, the reverse precharge signal /pre and the reverse equalize signal /eq rise to the H level, and precharge operation and equalize operation terminate. On the other hand, since the reverse compensation control signal /comp still maintains the L level, the leakage current compensation operation is continued. In this status, write or read operation of a desired RAM cell CL is carried out.

Figure 10:
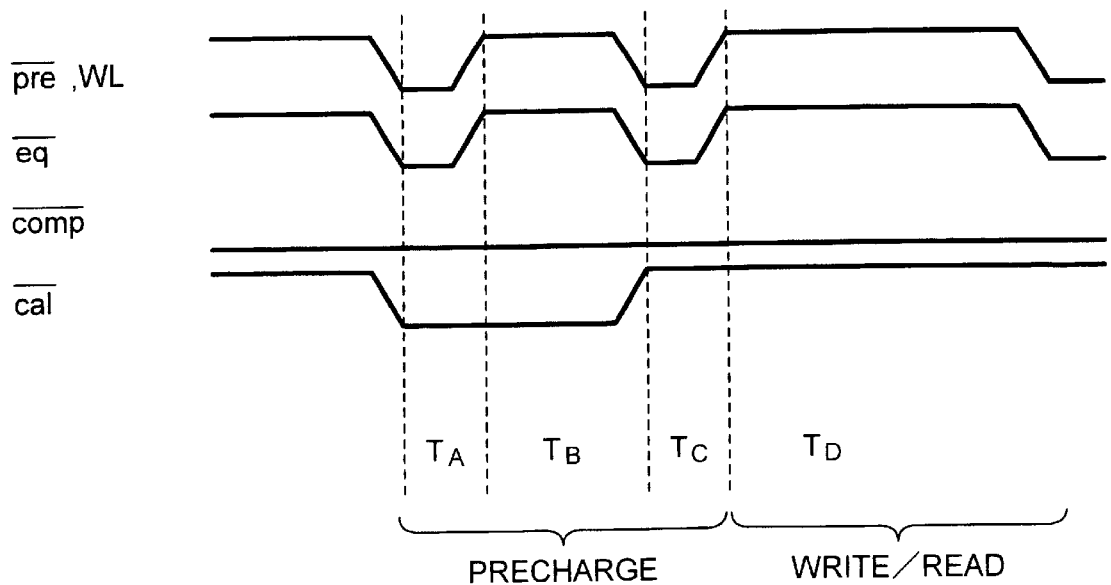
FIG. 10 is a timing chart that shows waveforms of control signals in a data transfer circuit according to the seventh embodiment of the invention.

FIG. 10 is a timing chart that shows waveforms of control signals in a data transfer circuit according to the seventh embodiment of the invention.

Circuit arrangement of the data transfer circuit according to the seventh embodiment is identical to the circuit arrangement of the data transfer circuit according to the sixth embodiment, and input portions of control signals used for controlling operations are also identical. However, as apparent from comparison between the timing chart of FIG. 10 with the timing chart of FIG. 9, the waveform of the reverse precharge signal /pre and the waveform of the reverse compensation control signal /comp are exchanged in the period TB.

That is, the data transfer circuit according to the seventh embodiment uses the fourth and eighth P-channel MOS transistors P4 and P8 instead of the second and sixth P-channel MOS transistors P2 and P6 for leakage current detecting operation, and uses the fourth and eighth P-channel MOS transistors P4 and P8 also for the leakage current compensating operation.

Since all P-channel MOS transistors used here have the same characteristics, even when using the second and sixth P-channel MOS transistors P2 and P6 for leakage current detecting operation and using the fourth and eighth P-channel MOS transistors P4 and P8 for leakage current compensating operation, as the data transfer circuit according to the sixth embodiment, no particular problems occur normally.

Strictly, however, P-channel MOS transistors are different in characteristics to a certain level. Therefore, if different transistors are used for leakage current detecting operation and leakage current compensation operation, there may occurs a difference between the magnitude of the detected leakage current and the magnitude of the compensated leakage current.

Taking it into consideration, the data transfer circuit according to the seventh embodiment uses common transistors for both leakage current detecting operation and leakage current compensating operation, thereby to prevent the problem of characteristic fluctuation.

Figure 11:
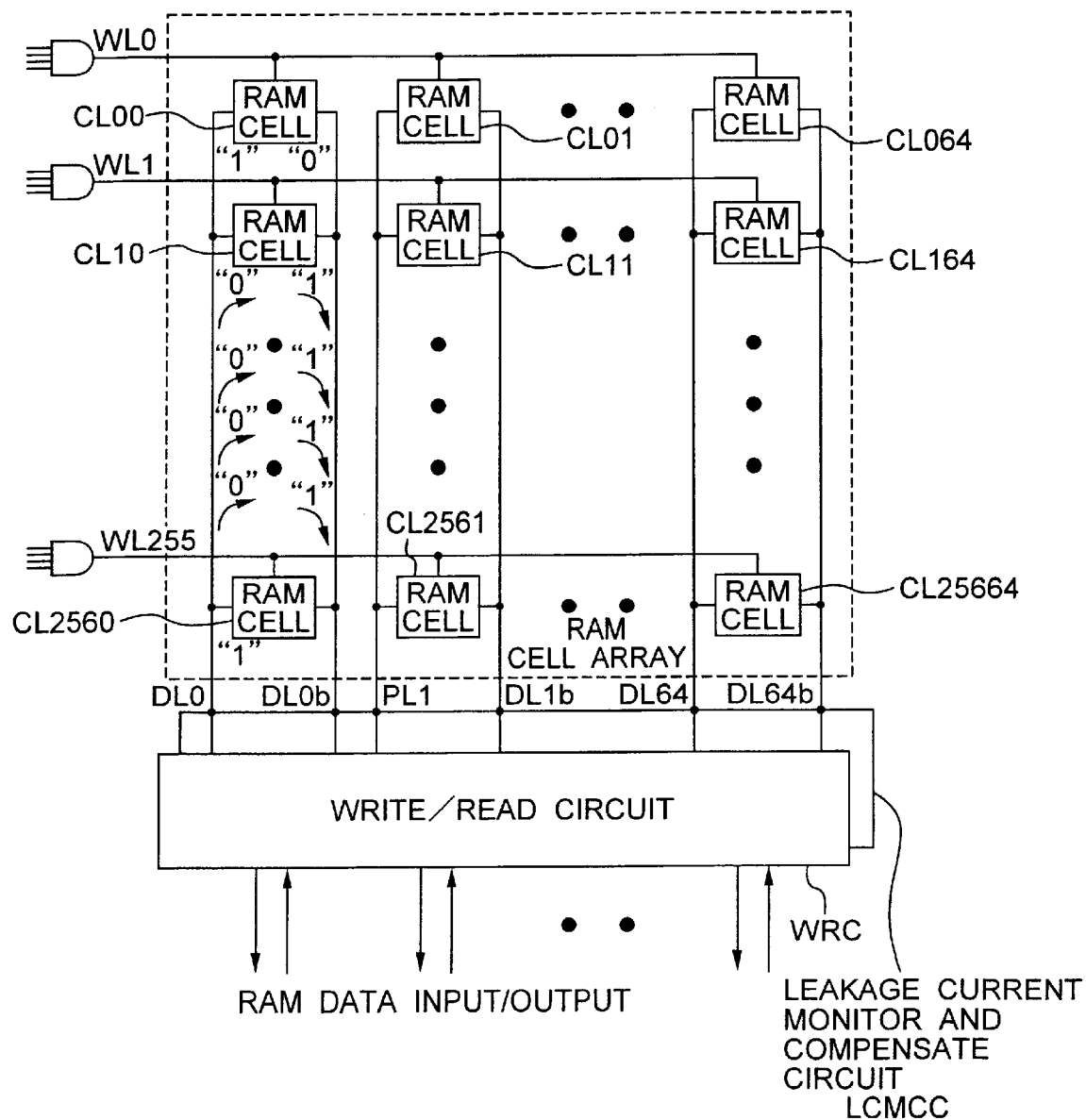
FIG. 11 is a block diagram that shows a configuration of a data transfer circuit according to the eighth embodiment of the invention.

FIG. 11 is a block diagram that shows a configuration of a data transfer circuit according to the eighth embodiment of the invention.

The data transfer circuit according to the eighth embodiment of the invention is a version in which the construction of the data transfer circuit according to the fourth embodiment or the fifth embodiment is applied to a semiconductor storage device having a RAM cell array of 256 rows and 64 columns. Specific configuration of each column is as already explained with the data transfer circuit according to the fourth embodiment or fifth embodiment.

Since the data transfer circuit according to the eighth embodiment includes 64 sets of data lines DL0 through DL64 and complementary data lines DL0b through DL64b, 64 sets of leakage current monitor and compensate circuits LCMCC are preferably provided in association with respective data line pairs. However, by sequential connection to individual data line pairs by time-divisional switching, a single leakage current monitor and compensate circuit LCMCC may be shared among 64 sets of data lines.

FIG. 11 is shown as connecting a write/read circuit WRC, in addition to the leakage current monitor and compensate circuit LCMCC, to the data lines and the complementary data lines, so is it also in FIG. 3 through FIG. 7.

Figure 12:
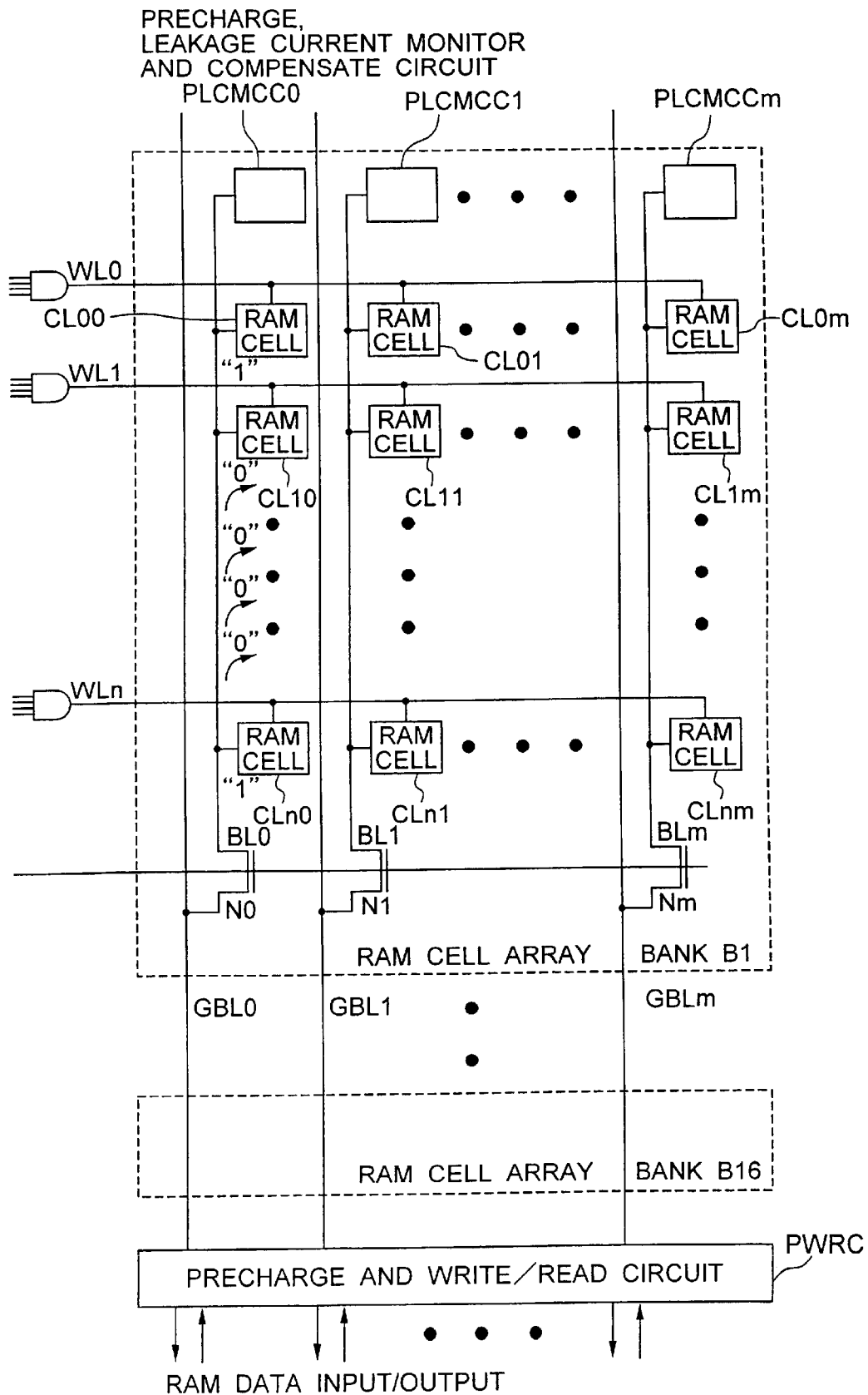
FIG. 12 is a block diagram that shows a configuration of a data transfer circuit according to the ninth embodiment of the invention.

FIG. 12 is a block diagram that shows a configuration of a data transfer circuit according to the ninth embodiment of the invention.

The data transfer circuit according to the ninth embodiment is a version applying configurations of the data transfer circuits according to the first to three embodiments to a semiconductor storage device having a plurality of hierarchical banks of RAM cell arrays. The RAM cell arrays shown here have 16 banks from the first bank B1 to the sixteenth bank B16.

The banks are connected longitudinally by global bit lines GBL0, GBL1, . . . , GBLm provided in individual columns of the RAM cell arrays. Then, for the first bank B1, for example, the respective global bit lines GBL0, GBL1, . . . , GBLm are connected to the local bit lines BL0, BL1, . . . , BLm of the first bank B1 via N-channel MOS transistors N0, N1, . . . , Nm that are bank-selecting switching devices. Selection of a bank is carried out by a bank selection signal BSS input to the bank-selecting switching device of each bank. Precharge of each global bit line and data input or output through each local bit line are executed by a precharge and write/read circuit PWRC connected to the global bit lines.

In the memory blocks having hierarchical bit lines (data line) as explained above, for certain memory blocks, it will be more efficient, depending upon the purpose of use, to access to the first bank B1 through the sixteenth bank B16 at random and continuously read out data, upon reading data, for example.

For such a memory block, upon continuous data read of the banks, read operation can be speeded up by precharging quickly only the global bit line as a higher hierarchical data line and sequentially reading out data of each bank. In this case, assume here that the circuit is configured to precharge/equalize a local bit line as a lower hierarchical data line directly connected to the RAM cells immediately after writing data in RAM cells of each bank and thereafter leave the local bit line not precharged or not equalized until continuous read of each bank as explained above is carried out. Then, if there is a leakage current in the local bit line of a particular bank, potential of the precharged local bit line may decrease significantly during a relatively long wait time after the precharge/equalize of the local bit line until the data read of the banks is carried out. That is, in case of a configuration of 16 banks, since the data read time of one bank is 1/16 of the data read time of all banks, all the data read time of the other banks is the wait time, and the potential of a precharged local bit line may decrease significantly during that wait time.

Taking it into consideration, the data transfer circuit according to the ninth embodiment additionally connects a precharge, leakage current monitor and compensate circuit PLCMCC to each local bit line of each bank. Therefore, even when a local bit line is not precharged or equalized after it is once precharged or equalized until continuous read of banks takes place, because a leakage current is detected, and a compensation current for compensating the leakage current is generated and supplied to the local bit line after completion of precharge operation until data write or read operation is carried out and upon data read operation, erroneous behaviors of the semiconductor storage device caused by the leakage current in the local bit line can be prevented beforehand.

The data transfer circuit according to the ninth embodiment has been shown as an example in which configurations of the data transfer circuits according to the first to third embodiments are applied to RAM cell arrays of respective banks. Instead, however, configurations of the data transfer circuits according to the fourth to eighth embodiments may be applied to RAM cell arrays of respective banks.

Further, in the data transfer circuit according to the ninth embodiment, the precharge, leakage current monitor and compensate circuit PLCMCC added to the local bit lines BL0, BL1, ..., BLm is provided in each bank. However, instead of adding the precharge, leakage current monitor and compensate circuit PLMCC to respective local bit lines BL0, BL1, ..., BLm, by adding it to respective global bit lines GBL0, GBL1, ..., GBLm and sequentially connecting it to the local bit lines of each bank by time divisional switching using N-channel MOS transistors No, N1, ..., Nm that are bank-selecting switching devices, a single precharge, leakage current monitor and compensate circuit PLMCC can be commonly shared by the local bit lines of each bank connected to a common global bit line GBL.

Figure 13:
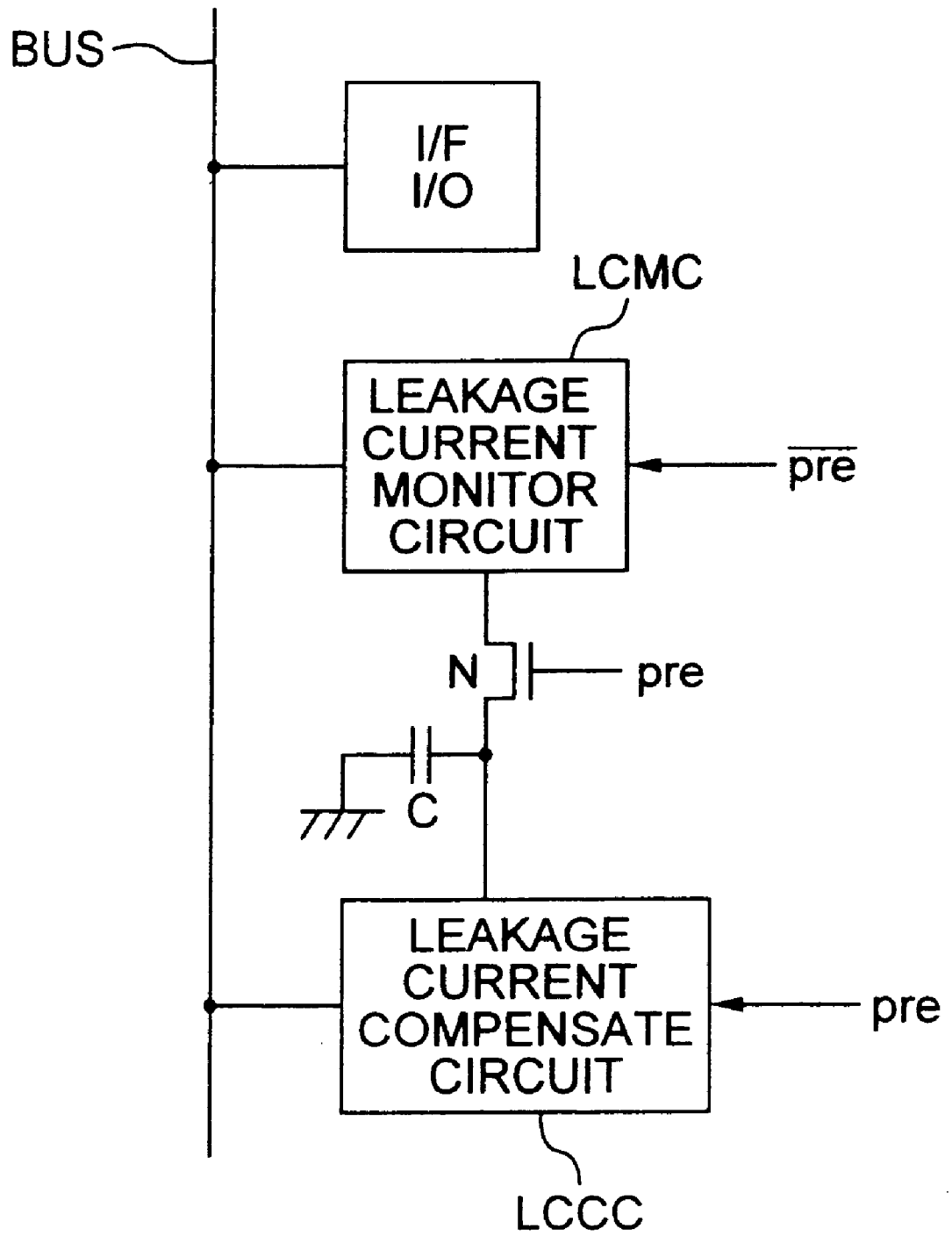
FIG. 13 is a block diagram that shows a configuration of a data transfer circuit according to the tenth embodiment of the invention.

FIG. 13 is a block diagram that shows a configuration of a data transfer circuit according to the tenth embodiment of the invention.

The data transfer circuit according to the tenth embodiment is a configuration of a basic concept, which wholly contains the above-explained embodiments, and this is a more general form of the configuration of the data transfer circuit according to the second embodiment shown in FIG. 4. That is, this embodiment shows that configuration of the data transfer circuit according to the invention is applicable not only to data lines (bit lines) of a semiconductor storage device but also to a data bus BUS to which one or more interface input/output blocks I/F·I/O are connected.

Regarding structures, connections and operations of the leakage current monitor circuit LCMC, N-channel MOS transistors N as transfer gates, capacitors C, and leakage current compensate circuit LCCC are identical or equivalent to those of the data transfer circuit according to the second embodiment.

Data width of the data but BUS may be determined as desired, and the number of interface input/output blocks I/F·I/O connected to the data bus BUS, as well, may be determined as desired. Circuit configuration of each interface input/output block I/F·I/O may be that of a wired OR circuit, tri-state buffer, multiplexer, or any other desired circuit.

As the transfer gates, P-channel MOS transistors, bipolar transistors or any other desired switching elements may be used in lieu of N-channel MOS transistors N.

What is claimed is:

1. A data transfer circuit comprising:
   one or more data lines of one column or a plurality of columns for transferring data;
   interface input/output blocks connected to said data lines for input or output of data through said data lines;
   a leakage current monitor and compensate circuit connected to said data lines to detect and store magnitudes of leakage currents in said data lines before input or output of data, and to generate compensation currents and supply the compensation currents generated to said data lines to compensate said leakage currents upon input or output of data.

2. The data transfer circuit according to claim 1 wherein said leakage current monitor and compensate circuit includes:
   a leakage current monitor circuit connected to said data lines to detect magnitudes of leakage currents in said data lines before input or output of data;
   a leakage current storage element for storing magnitudes of the detected leakage currents; and
   a leakage current compensate circuit for generating compensation currents that compensate said leakage currents upon input or output of data, based on magnitudes of the stored leakage currents, and for supplying them to said data lines.

3. The data transfer circuit according to claim 2 wherein said leakage current monitor circuit is a circuit connected to said data lines to detect potentials of said data lines generated in response to magnitudes of leakage currents in said data lines before input or output of data,
   said leakage current storage element being a capacitor that accumulates electric charges corresponding to the detected potentials of said data lines and generates potentials equivalent to said potentials of the data lines,
   said leakage current compensate circuit being a circuit that generates compensation currents for compensating said leakage currents upon input or output of data on the bases of the potentials generated by said capacitor, and supplies them to said data lines.

4. The data transfer circuit according to claim 2 wherein said leakage current monitor circuit is a circuit connected to said data lines to detect potentials of said data lines generated in response to magnitudes of leakage currents in said data lines before input or output of data,
   said leakage current storage element being a switch for transmitting the detected potentials of said data lines, and a capacitor for accumulating electric charges corresponding to the transmitted potentials of said data lines and generating potentials equivalent to said potentials of the data lines,
   said leakage current compensate circuit being a circuit that generates compensation currents for compensating said leakage currents upon input or output of data on the bases of the potentials generated by said capacitor, and supplies them to said data lines.

5. The data transfer circuit according to claim 1 wherein said leakage current monitor and compensate circuit includes:
   a first P-channel MOS transistor having a gate and a drain connected to said data lines;
   a second P-channel MOS transistor having a drain connected to said data lines;
   a third MOS transistor connected between a source potential node and the source of said first P-channel MOS transistor and supplied at its gate with a first control signal;
   a fourth MOS transistor connected between the source potential node and the source of said second P-channel MOS transistor, and supplied at its gate with a second control signal;
   a capacitor connected between the gate of said second P-channel MOS transistor and a ground potential node; and a switching element connected between said data lines and the gate of said second P-channel MOS transistor and ON/OFF-controlled by a third control signal.

6. A data transfer circuit comprising:
one or more data lines of one column or a plurality of columns for transferring data;
a plurality of memory cells each connected to said data lines for write or read of data through said data lines;
a single or plurality of word lines connected to respective said memory cells to select a memory cell that is the subject of write or read of the data;
a leakage current monitor and compensate circuit connected to said data lines to detect and store magnitudes of leakage current in said data lines before write or read of data, then generate compensation currents for compensating said leakage currents in said data lines upon write or read of the data and supply them to said data lines.

7. The data transfer circuit according to claim 6 wherein said leakage current monitor and compensate circuit includes:
a leakage current monitor circuit connected to said data lines to detect magnitudes of leakage currents in said data lines before input or output of data;
a leakage current storage element for storing magnitudes of the detected leakage currents; and
a leakage current compensate circuit for generating compensation currents that compensate said leakage currents upon input or output of data, based on magnitudes of the stored leakage currents, and for supplying them to said data lines.

8. The data transfer circuit according to claim 7 wherein said leakage current monitor circuit is a circuit connected to said data lines to detect potentials of said data lines generated in response to magnitudes of leakage currents in said data lines before input or output of data,
said leakage current storage element being a capacitor that accumulates electric charges corresponding to the detected potentials of said data lines and generates potentials equivalent to said potentials of the data lines,
said leakage current compensate circuit being a circuit that generates compensation currents for compensating said leakage currents upon input or output of data on the bases of the potentials generated by said capacitor, and supplies them to said data lines.

9. The data transfer circuit according to claim 7 wherein said leakage current monitor circuit is a circuit connected to said data lines to detect potentials of said data lines generated in response to magnitudes of leakage currents in said data lines before input or output of data,
said leakage current storage element being a switch for transmitting the detected potentials of said data lines, and a capacitor for accumulating electric charges corresponding to the transmitted potentials of said data lines and generating potentials equivalent to said potentials of the data lines,
said leakage current compensate circuit being a circuit that generates compensation currents for compensating said leakage currents upon input or output of data on the bases of the potentials generated by said capacitor, and supplies them to said data lines.

10. The data transfer circuit according to claim 6 wherein said leakage current monitor and compensate circuit includes:
a first P-channel MOS transistor having a gate and a drain connected to said data lines;
a second P-channel MOS transistor having a drain connected to said data lines;
a third MOS transistor connected between a source potential node and the source of said first P-channel MOS transistor and supplied at its gate with a first control signal;
a fourth MOS transistor connected between the source potential node and the source of said second P-channel MOS transistor, and supplied at its gate with a second control signal;
a capacitor connected between the gate of said second P-channel MOS transistor and a ground potential node; and
a switching element connected between said data lines and the gate of said second P-channel MOS transistor and ON/OFF-controlled by a third control signal.

11. The data transfer circuit according to claim 6 wherein only one of said leakage current monitor and compensate circuit is provided and shared by said data lines through a switch performing time-divisional switching.

12. The data transfer circuit according to claim 6 including a plurality of banks of respective said components, and further comprising:
a single column or a plurality of columns of global data lines provided in association with individual data lines of a common column of each said bank; and
bank-selecting switching devices each connected between each said data line and said global data line associated with each said data line to be supplied with bank-selecting signals for respective banks.

13. The data transfer circuit according to claim 12 wherein said leakage current monitor and compensate circuit is provided for each said global data line to be selectively connected to said data lines via said global data lines by time-divisional switching of said bank-selecting switching device and commonly shared by data lines in a common column of each said bank.

14. A data transfer circuit comprising:
one or more data lines of one column or a plurality of columns for transferring data;
a single column or a plurality of columns of complementary data lines each making a pair with each said data lines to transfer reverse data of said data;
a plurality of memory cells each connected to said data lines and said complementary data lines for write or read of data through said data lines and said complementary data lines;
a plurality of word lines connected to respective said memory cells to select a memory cell that is the subject of write or read of the data;
a data-line-side leakage current monitor and compensate circuit connected to said data lines to detect and store magnitudes of leakage current in said data lines before write or read of data, then generate compensation currents for compensating said leakage currents in said data lines upon write or read of the data and supply them to said data lines; and
a complementary-data-line-side leakage current monitor and compensate circuit connected to said complementary data lines to detect and store magnitudes of leakage current in said complementary data lines before write or read of data, then generate compensation currents for compensating said leakage currents in said data lines upon write or read of the data and supply them to said complementary data lines.

15. The data transfer circuit according to claim 14 wherein said leakage current monitor and compensate circuit includes:
- a leakage current monitor circuit connected to said data lines to detect magnitudes of leakage currents in said data lines before input or output of data;
- a leakage current storage element for storing magnitudes of the detected leakage currents; and
- a leakage current compensate circuit for generating compensation currents that compensate said leakage currents upon input or output of data, based on magnitudes of the stored leakage currents, and for supplying them to said data lines.

16. The data transfer circuit according to claim 15 wherein said leakage current monitor circuit is a circuit connected to said data lines to detect potentials of said data lines generated in response to magnitudes of leakage currents in said data lines before input or output of data,
- said leakage current storage element being a capacitor that accumulates electric charges corresponding to the detected potentials of said data lines and generates potentials equivalent to said potentials of the data lines,
- said leakage current compensate circuit being a circuit that generates compensation currents for compensating said leakage currents upon input or output of data on the bases of the potentials generated by said capacitor, and supplies them to said data lines.

17. The data transfer circuit according to claim 15 wherein said leakage current monitor circuit is a circuit connected to said data lines to detect potentials of said data lines generated in response to magnitudes of leakage currents in said data lines before input or output of data,
- said leakage current storage element being a switch for transmitting the detected potentials of said data lines, and a capacitor for accumulating electric charges corresponding to the transmitted potentials of said data lines and generating potentials equivalent to said potentials of the data lines,
- said leakage current compensate circuit being a circuit that generates compensation currents for compensating said leakage currents upon input or output of data on the bases of the potentials generated by said capacitor, and supplies them to said data lines.

18. The data transfer circuit according to claim 14 wherein said data-line-side leakage current monitor and compensate circuit and said complementary-data-line-side leakage current monitor and compensate circuit include:
- a first P-channel MOS transistor having a gate and a drain connected to said data lines;
- a second P-channel MOS transistor having a drain connected to said data lines;
- a third P-channel MOS transistor having a gate and a drain connected to said complementary data lines;
- a fourth P-channel MOS transistor having a drain connected to said complementary data lines;
- a fifth MOS transistor connected between a source potential node and the source of said first P-channel MOS transistor and supplied at its gate with a first control signal;
- a sixth MOS transistor connected between the source potential node and the source of said second P-channel MOS transistor, and supplied at its gate with a second control signal;
- a first capacitor connected between the gate of said second P-channel MOS transistor and a ground potential node;
- a first switching element connected between said data lines and the gate of said second P-channel MOS transistor and ON/OFF-controlled by a third control signal;
- a seventh MOS transistor connected between a source potential node and the source of said third P-channel MOS transistor and supplied at its gate with said first control signal;
- an eighth MOS transistor connected between a source potential node and the source of said fourth P-channel MOS transistor and supplied at its gate with said second control signal;
- a second capacitor connected between the gate of said fourth P-channel MOS transistor and a ground potential node; and
- a second switching element connected between said complementary data lines and the gate of said fourth P-channel MOS transistor and ON/OFF-controlled by said third control signal.

19. The data transfer circuit according to claim 18 wherein said leakage current monitor and compensate circuit and said complementary-data-line-side leakage current monitor and compensate circuit further includes a third switching element connected between said data lines and said complementary data lines and ON/OFF-controlled by a fourth control signal.

20. The data transfer circuit according to claim 14 wherein only one said leakage current monitor and compensate circuit and only one said complementary-data-line-side leakage current monitor and compensate circuit are provided, and shared by said data lines and said complementary data lines through switches performing time-divisional switching.

* * * * *

UNITED STATES PATENT AND TRADEMARK OFFICE
CERTIFICATE OF CORRECTION

PATENT NO.    : 6,343,039 B2
DATED         : January 29, 2002
INVENTOR(S)   : Agawa et al.

It is certified that error appears in the above-identified patent and that said Letters Patent is hereby corrected as shown below:

<u>Title page,</u>
Item [30], the Foreign Application Priority information should read:

-- [30]    Foreign Application Priority Data
   Jan. 7, 2000   (JP) ............................. 2000-002010 --

Signed and Sealed this

Third Day of September, 2002

Attest:

Attesting Officer

JAMES E. ROGAN
Director of the United States Patent and Trademark Office